(12) United States Patent
Renault (10) Patent No.: US 9,908,774 B2
(45) Date of Patent: Mar. 6, 2018

(54) METHOD FOR ACHIEVING GOOD ADHESION BETWEEN DIELECTRIC AND ORGANIC MATERIAL

(71) Applicant: CAVENDISH KINETICS, INC., San Jose, CA (US)

(72) Inventor: Mickael Renault, San Jose, CA (US)

(73) Assignee: CAVENDISH KINETICS, INC., San Jose, CA (US)

( * ) Notice: Subject to any disclaimer, the term of this patent is extended or adjusted under 35 U.S.C. 154(b) by 0 days.

(21) Appl. No.: 15/024,942

(22) PCT Filed: Sep. 15, 2014

(86) PCT No.: PCT/US2014/055581
§ 371 (c)(1),
(2) Date: Mar. 25, 2016

(87) PCT Pub. No.: WO2015/050688
PCT Pub. Date: Apr. 9, 2015

(65) Prior Publication Data
US 2016/0221823 A1    Aug. 4, 2016

Related U.S. Application Data

(60) Provisional application No. 61/885,687, filed on Oct. 2, 2013.

(51) Int. Cl.
*B81C 1/00* (2006.01)
(52) U.S. Cl.
CPC ........ *B81C 1/0038* (2013.01); *B81C 1/00801* (2013.01); *B81C 2201/0108* (2013.01); *B81C 2201/0176* (2013.01); *B81C 2201/053* (2013.01)

(58) Field of Classification Search
CPC .............. B81C 1/0038; B81C 1/00801; B81C 2201/053; B81C 2201/0108; B81C 2201/0176; B81C 1/00476; B81C 1/0036
See application file for complete search history.

(56) References Cited

U.S. PATENT DOCUMENTS 6,159,385 A    12/2000    Yao et al.
6,303,525 B1    10/2001    Annapragada
(Continued)

FOREIGN PATENT DOCUMENTS

CN        1411607 A        4/2003

OTHER PUBLICATIONS

Chinese Office Action in related application CN 20140054613.1 dated Nov. 28, 2016.
(Continued)

*Primary Examiner* — Savitr Mulpuri
(74) *Attorney, Agent, or Firm* — Patterson + Sheridan, LLP; Steven H. VerSteeg (57) ABSTRACT

The present invention generally relates to a method for forming a MEMS device and a MEMS device formed by the method. When forming the MEMS device, sacrificial material is deposited around the switching element within the cavity body. The sacrificial material is eventually removed to free the switching element in the cavity. The switching element has a thin dielectric layer thereover to prevent etchant interaction with the conductive material of the switching element. During fabrication, the dielectric layer is deposited over the sacrificial material. To ensure good adhesion between the dielectric layer and the sacrificial material, a silicon rich silicon oxide layer is deposited onto the sacrificial material before depositing the dielectric layer thereon.

8 Claims, 7 Drawing Sheets

(56) References Cited

U.S. PATENT DOCUMENTS

| | | | |
|---|---|---|---|
| 9,142,804 B2* | 9/2015 | Lee | ................... H01L 27/3274 |
| 2003/0047533 A1 | 3/2003 | Reid et al. | |
| 2003/0206701 A1 | 11/2003 | Godil et al. | |
| 2013/0140547 A1 | 6/2013 | Lee et al. | |

OTHER PUBLICATIONS

Chinese office action for application 201480054613.1 dated Aug. 2, 2017.

* cited by examiner

METHOD FOR ACHIEVING GOOD ADHESION BETWEEN DIELECTRIC AND ORGANIC MATERIAL

BACKGROUND OF THE INVENTION

Field of the Invention

Embodiments of the present invention generally relate to a method for forming a micro-electromechanical systems (MEMS) device and a MEMS device formed.

Description of the Related Art

MEMS devices typically include a movable plate (i.e., switching element) that is movable between multiple positions, such as between a position in close contact with an electrode and a position spaced from the electrode. Some MEMS devices are used in digital variable capacitors (DVC).

Some DVC devices are based on a moveable MEMS element with a control-electrode above (i.e., a pull-up or pull-off or PU-electrode) and below (i.e., a pull-in or pull-down or PD-electrode) the moveable MEMS element. In addition there is an RF-electrode below the moveable MEMS element (i.e., switching element or switching member or plate or cantilever or movable plate electrode). During operation a voltage is applied to either the PU or PD-electrode, which causes the MEMS element to be pulled-up or pulled-down in contact to provide a stable minimum or maximum capacitance to the RF-electrode. In this way the capacitance from the moveable element to the RF-electrode (which resides below the moveable element) can be varied from a high capacitance $C_{max}$ when pulled to the bottom to a low capacitance $C_{min}$ when pulled to the top.

To form the MEMS device, the switching element is disposed within a cavity and partially surrounded by sacrificial material that is later removed. Removing the sacrificial material may lead to the etchant interacting with the conductive material of the switching element. Thus, a dielectric material may be formed between the sacrificial material and the switching element. The dielectric material and the sacrificial material may not adhere well to one another and thus, the dielectric material may delaminate from the sacrificial material, which leads to poor device fabrication conditions.

Therefore, there is a need in the art for adhering sacrificial and dielectric material in a MEMS device.

SUMMARY OF THE INVENTION

The present invention generally relates to a method for forming a MEMS device and a MEMS device formed by the method. When forming the MEMS device, sacrificial material is deposited around the switching element within the cavity body. The sacrificial material is eventually removed to free the switching element in the cavity. The switching element has a thin dielectric layer thereover to prevent etchant interaction with the conductive material of the switching element. During fabrication, the dielectric layer is deposited over the sacrificial material. To ensure good adhesion between the dielectric layer and the sacrificial material, a silicon rich silicon oxide layer is deposited onto the sacrificial material before depositing the dielectric layer thereon.

In one embodiment, a method of forming a MEMS device comprises depositing an organic based sacrificial layer over an electrode; depositing a silicon containing layer over the organic based sacrificial layer, wherein the silicon containing layer has an amount of silicon greater than a stoichiometric silicon layer; and depositing a dielectric layer over the silicon rich layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to a method for forming a MEMS device and a MEMS device formed by the method. When forming the MEMS device, sacrificial material is deposited around the switching element within the cavity body. The sacrificial material is eventually removed to free the switching element in the cavity. The switching element has a thin dielectric layer thereover to prevent etchant interaction with the conductive material of the switching element. During fabrication, the dielectric layer is deposited over the sacrificial material. To ensure good adhesion between the dielectric layer and the sacrificial material, a silicon rich silicon oxide layer is deposited onto the sacrificial material before depositing the dielectric layer thereon.

Figure 1:
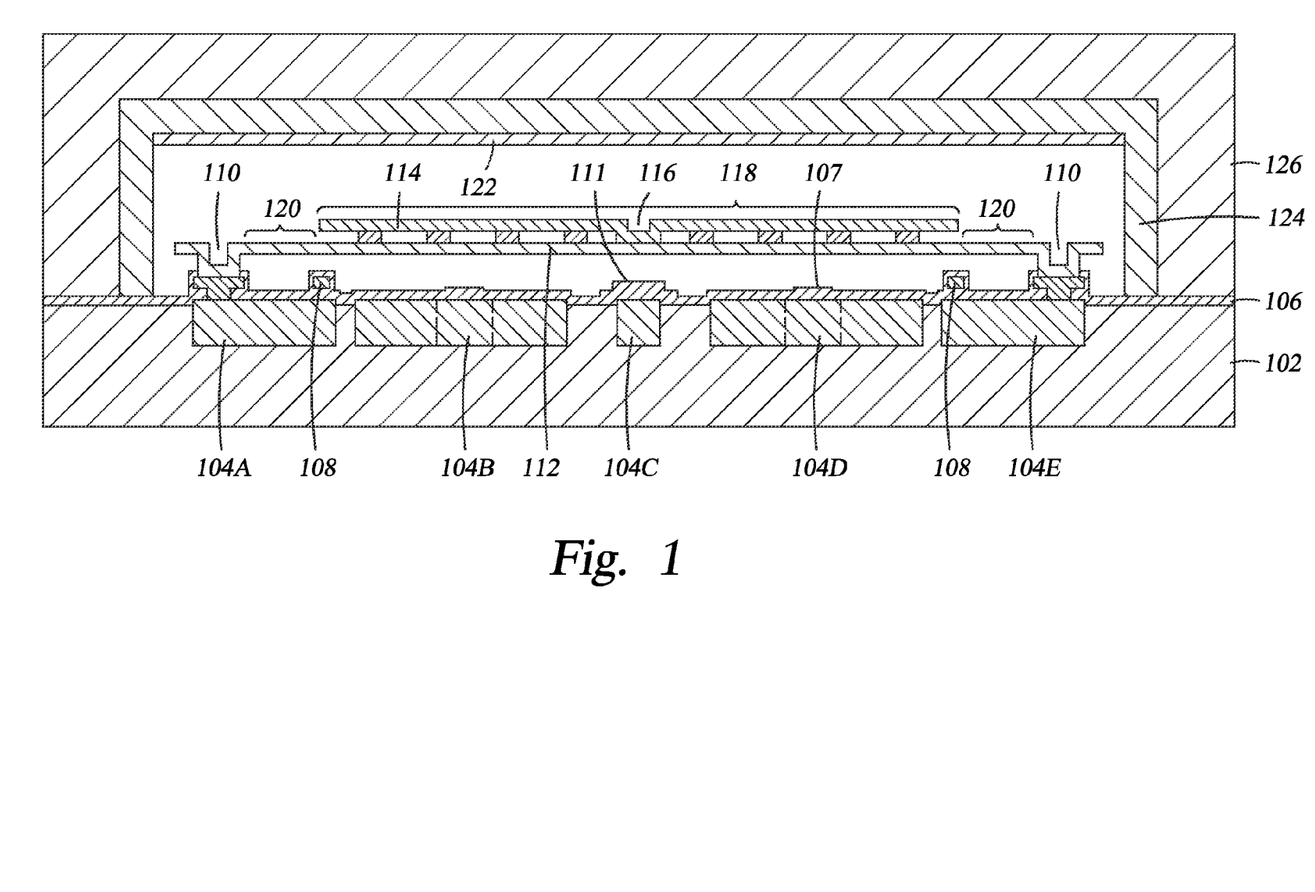
FIG. 1 is a schematic cross-sectional illustration of a MEMS device according to one embodiment.

FIG. 1 is a schematic cross-sectional illustration of a MEMS device 100 according to one embodiment. The MEMS device 100 includes a substrate 102 having a plurality of electrodes 104A-104E thereon. The substrate 102 may comprise a single layer substrate or a multi-layer substrate such as found in a complementary metal oxide semiconductor (CMOS) fabrication process. While not shown, the substrate 102 will have electrical connections therethrough to the electrodes 104A-104E.

The electrodes 104A-104E may be formed by depositing electrically conductive material over the substrate and then patterning the electrically conductive material. Suitable materials that may be used for the electrodes 104A-104E include tungsten, titanium, tantalum, titanium nitride, copper, aluminum, titanium aluminum, and combinations thereof. The electrodes 104A-104E may be formed from a single layer of electrically conductive material or multiple layers of conductive materials. Additionally, the multiple layers may comprise different materials.

A dielectric layer 106 is disposed over the electrodes 104A-104E and may be designed such that PB contacts 108 near the ground electrodes 104A, 104E are present. Additionally, SL contacts 107 may be disposed over/adjacent the pull-down electrodes 104B, 104D. Finally, an RF contact 111 may be disposed over the RF electrode 104C. The dielectric layer 106 may comprise a silicon based dielectric such as silicon oxide, silicon nitride, silicon oxynitride or combinations thereof.

The movable plate or switching element is disposed in the cavity and comprises a bottom plate 112 and a top plate 114 coupled thereto by posts. The switching element comprises electrically conductive material such as tungsten, titanium, tantalum, titanium nitride, copper, aluminum, titanium aluminum, and combinations thereof. The switching element has an anchor portion 110 coupled to the ground electrodes 104A, 104E and a stiff portion 118 comprised of the portion where the top plate 114 is coupled to the bottom plate 112. Flexible leg portions 120 are between the anchors 110 and the stiff portion 118. A trench 116 may be present in the top plate 114 such that the top plate 114 is directly in contact with the bottom plate 112.

While not shown, the switching element may have a dielectric layer surrounding the electrically conductive material. The cavity is enclosed by a pull-up electrode 124 having a dielectric layer 122 bordering the cavity, and by an encapsulating layer 126. The dielectric layer 122 and the dielectric layer surrounding the electrically conductive material for the switching element may comprise silicon oxide, silicon nitride, silicon oxynitride. The electrode 124 may comprise tungsten, titanium, tantalum, titanium nitride, copper, aluminum, titanium aluminum, and combinations thereof. The encapsulating layer 126 may comprise silicon oxide, silicon nitride, silicon oxynitride and combinations thereof.

Figure 2A:
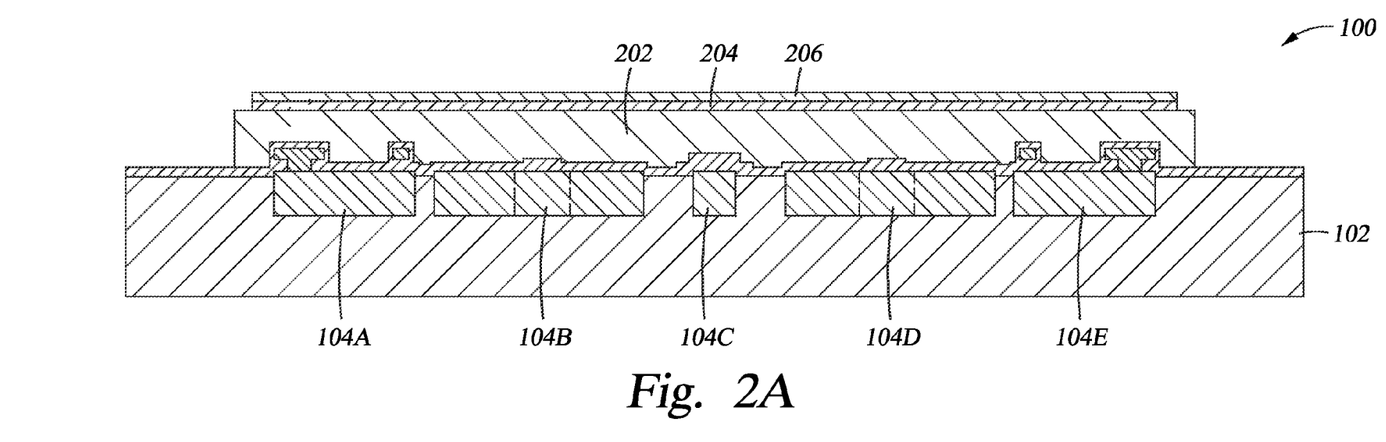
FIGS. 2A-2G are schematic illustrations of a MEMS device at various stages of fabrication according to one embodiment.
Figure 2B:
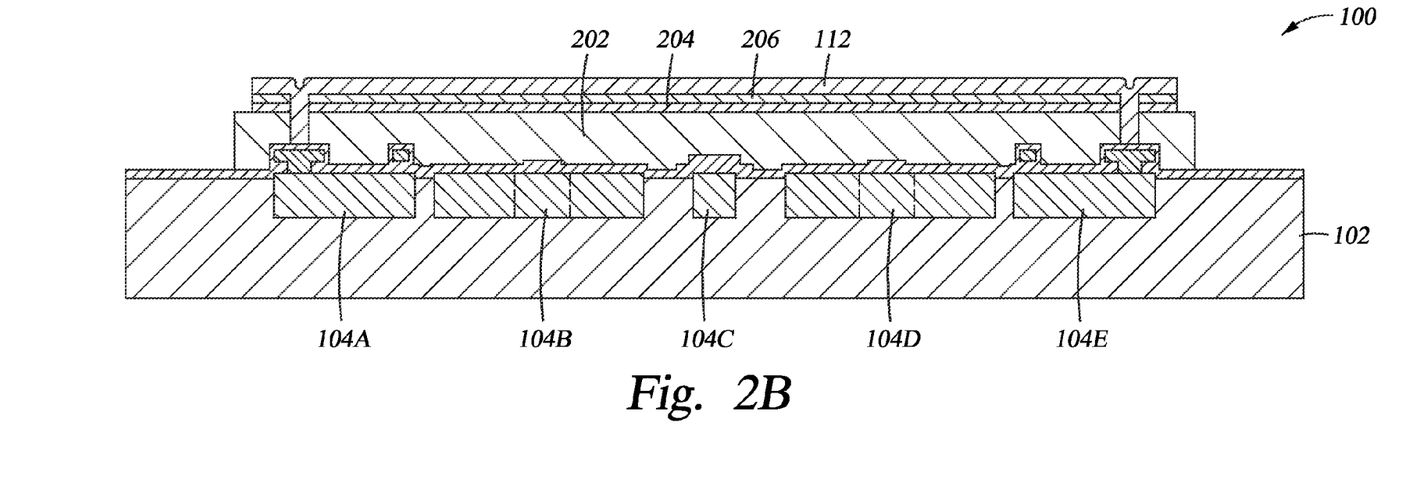

FIGS. 2A-2G are schematic illustrations of a MEMS device 100 at various stages of fabrication according to one embodiment. The MEMS device 100 is fabricated by forming the electrodes 104A-104E over the substrate 102 and depositing the dielectric layer 106 thereon. As shown in FIG. 2A, a sacrificial layer 202 is then deposited to at least partially define the boundaries of the cavity. The sacrificial layer 202 may comprise an organic material.

To ensure good adhesion, a silicon rich layer 204 is then deposited on the sacrificial layer 202. In one embodiment, the silicon rich layer 204 comprises non-stoichiometric silicon dioxide (i.e., layer 204 has more silicon present that is present in stoichiometric silicon dioxide). The silicon rich layer 204 may be deposited by plasma enhanced chemical vapor deposition (PECVD) in which a silicon containing gas, such as silane, is introduced into the chamber along with an oxygen containing gas, such as $N_2O$ or $O_2$ and ignited into a plasma. An inert gas, such as argon, helium or diatomic nitrogen may also be present. The silicon rich layer 204 has a greater silicon content than is present in a stoichiometric silicon based layer. Hence, the silicon rich layer 204 is non-stoichiometric. The good adhesion is provided by forming the silicon rich layer 204 at the interface between the organic material and the dielectric layer 206.

The silicon rich layer 204 can be formed in a variety of ways depending on the dielectric composition. In one embodiment, the layer 204 is formed as a Si-rich PECVD oxide. The gases used to deposit the oxide are $SiH_4$, $N_2O$ & $N_2$. The deposition can be performed by flowing a gas mixture having a higher $SiH_4$ to $N_2O$ or SiH4 to ($N_2O+N_2$) ratio when initiating the deposition in order to form a single layer that is the equivalent to layers 204 and 206 combined. In other words, a separate dielectric layer would not be necessary when formed using the higher $SiH_4$ to $N_2O$ or SiH4 to ($N_2O+N_2$) ratio when initiating the deposition. Si-rich PECVD oxide can also be deposited through modification of the oxide initiation. The deposition chamber is then saturated by a Si-rich mixture and it will result in about a 1 nm to about 3 nm thick Si-rich layer before steady state conditions are reached. In another embodiment, a Si-rich oxide deposited through a multi-layer deposition. In this case, a separate deposition step is created to deposit a Si-rich oxide. The deposition can be performed by using a gas mixture having a higher $SiH_4$ to $N_2O$ or $SiH_4$ to ($N_2O+N_2$) ratio than the one used for steady state. It will result in a Si-rich layer having a thickness of a few nanometers. Material other than PECVD oxide can be used such as Si-containing material like silicon nitride, amorphous silicon or spin-on can be used as well. Their thickness will typically be a few nanometers.

Over the silicon rich layer 204 (i.e., the non-stoichiometric silicon dielectric layer), a stoichiometric dielectric layer 206 is deposited. The dielectric layer 206 may comprise silicon oxide, silicon nitride or silicon oxynitride. The dielectric layers 204, 206 are shown to be deposited and then patterned prior to forming the bottom plate 112 (See FIG. 2B), but it is to be understood that the bottom plate 112 and the dielectric layers 204, 206 may be patterned together.

Figure 2C:
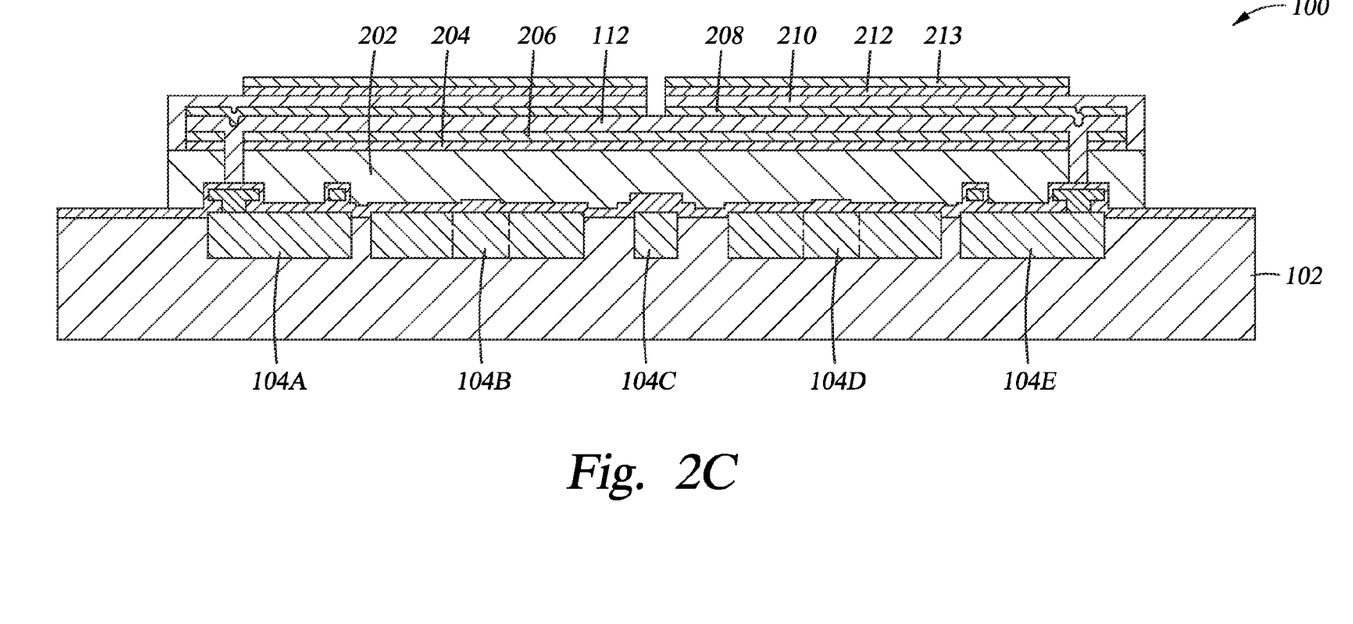

As shown in FIG. 2C, another stoichiometric dielectric layer 208 is deposited onto the bottom plate 112. The dielectric layer 208 may comprise silicon oxide, silicon nitride or silicon oxynitride. The dielectric layer 208 may be patterned when the bottom plate 112 is patterned. Another sacrificial layer 210 is deposited over the dielectric layer 208 and the first sacrificial layer 202. The sacrificial layers 202, 210 comprise the same material and collectively define at least part of the cavity.

On top of the sacrificial layer 210, another silicon rich layer 212 is deposited as is a dielectric layer 213. The silicon rich layer 212 may comprise the same material and be deposited in the same manner as silicon rich layer 204 discussed above. Similarly, dielectric layer 213 may comprise stoichiometric silicon oxide, silicon nitride or silicon oxynitride. During patterning, the bottom plate 112 is exposed.

Figure 2D:
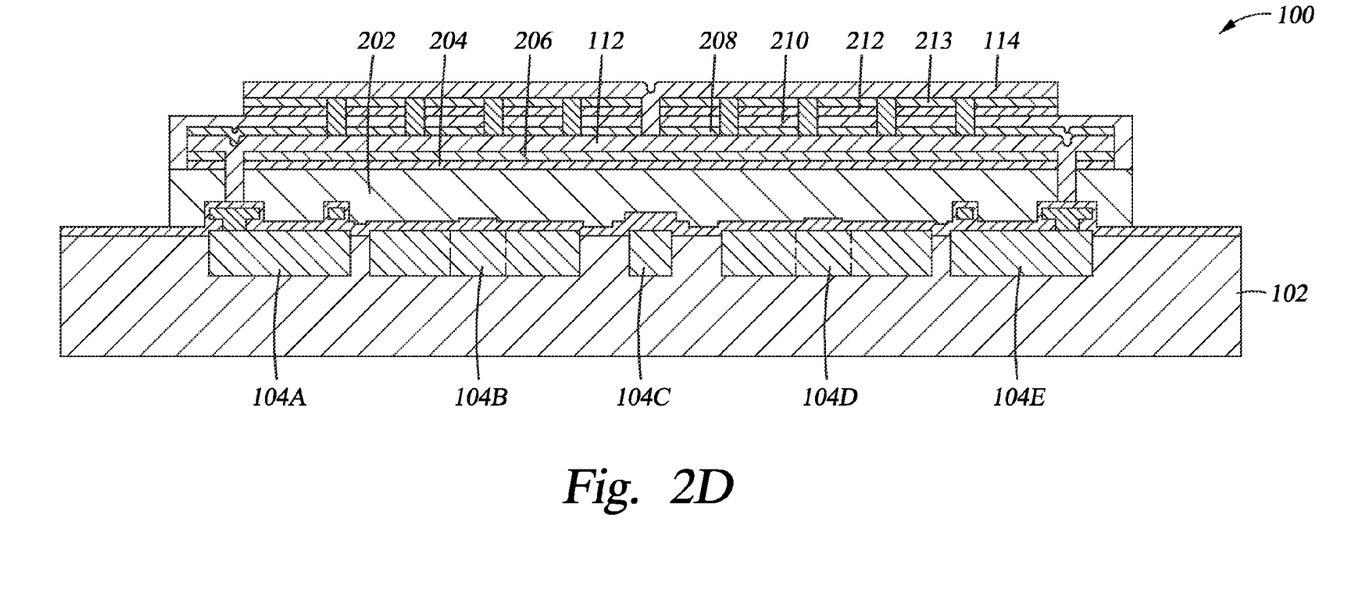
Figure 2E:
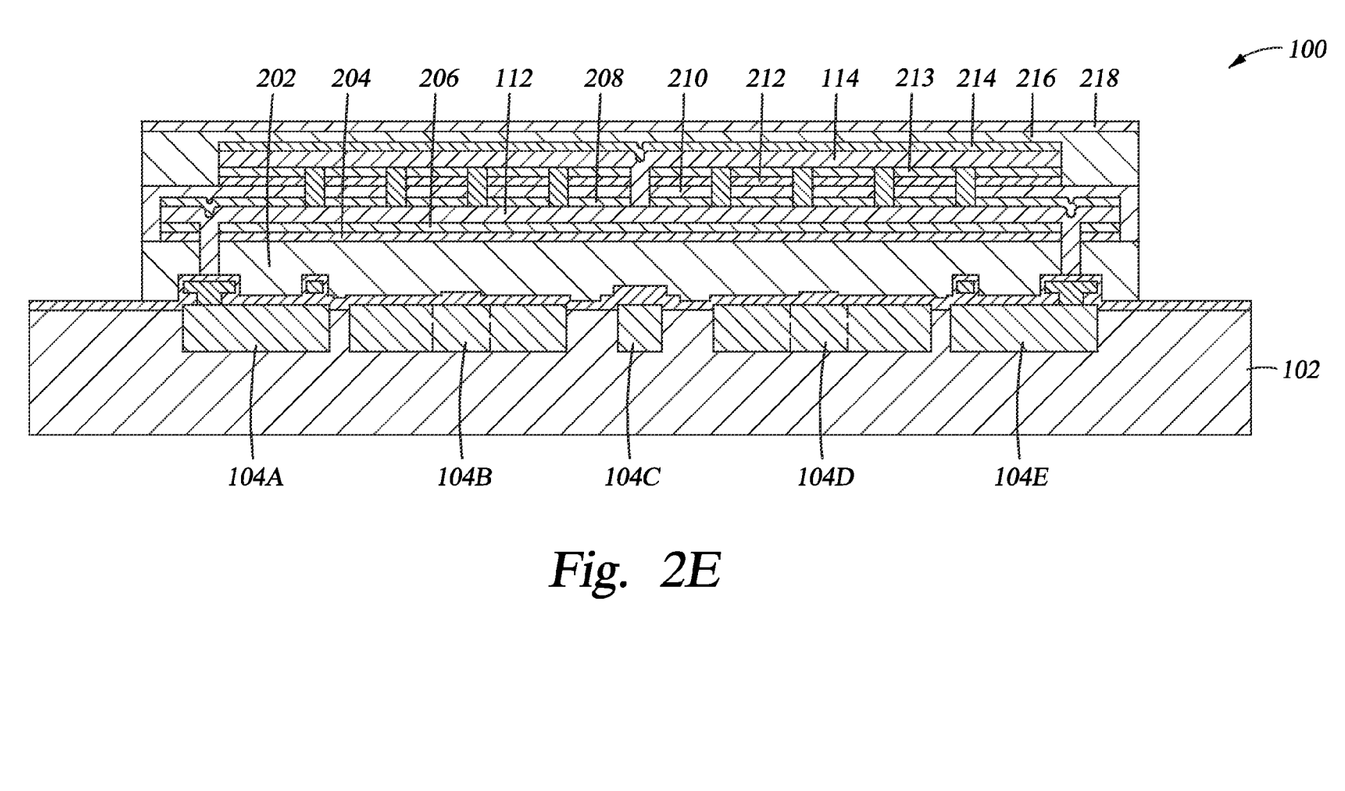

The top plate 114 is then deposited over the dielectric layer 213 and within vias formed through the various layers to connect the top plate 114 and the bottom plate 112 as shown in FIG. 2D. A dielectric layer 214 may be deposited on the top plate 114 as shown in FIG. 2E. The dielectric layer 214 and the top plate 114 may be patterned together or patterned separately.

Following formation of the dielectric layer 214, another sacrificial layer 216 is deposited. The sacrificial layers 202, 210, 216 collectively define the boundaries of the cavity. The sacrificial layers 202, 210, 216 may all comprise the same material and be deposited by the same deposition methods. Following deposition of the sacrificial layer 216, a silicon rich layer 218 is deposited as shown in FIG. 2E. The silicon rich layer 218 may comprise the same materials and be deposited in the same manner and to the same thickness as silicon rich layers 204, 212.

Figure 2F:
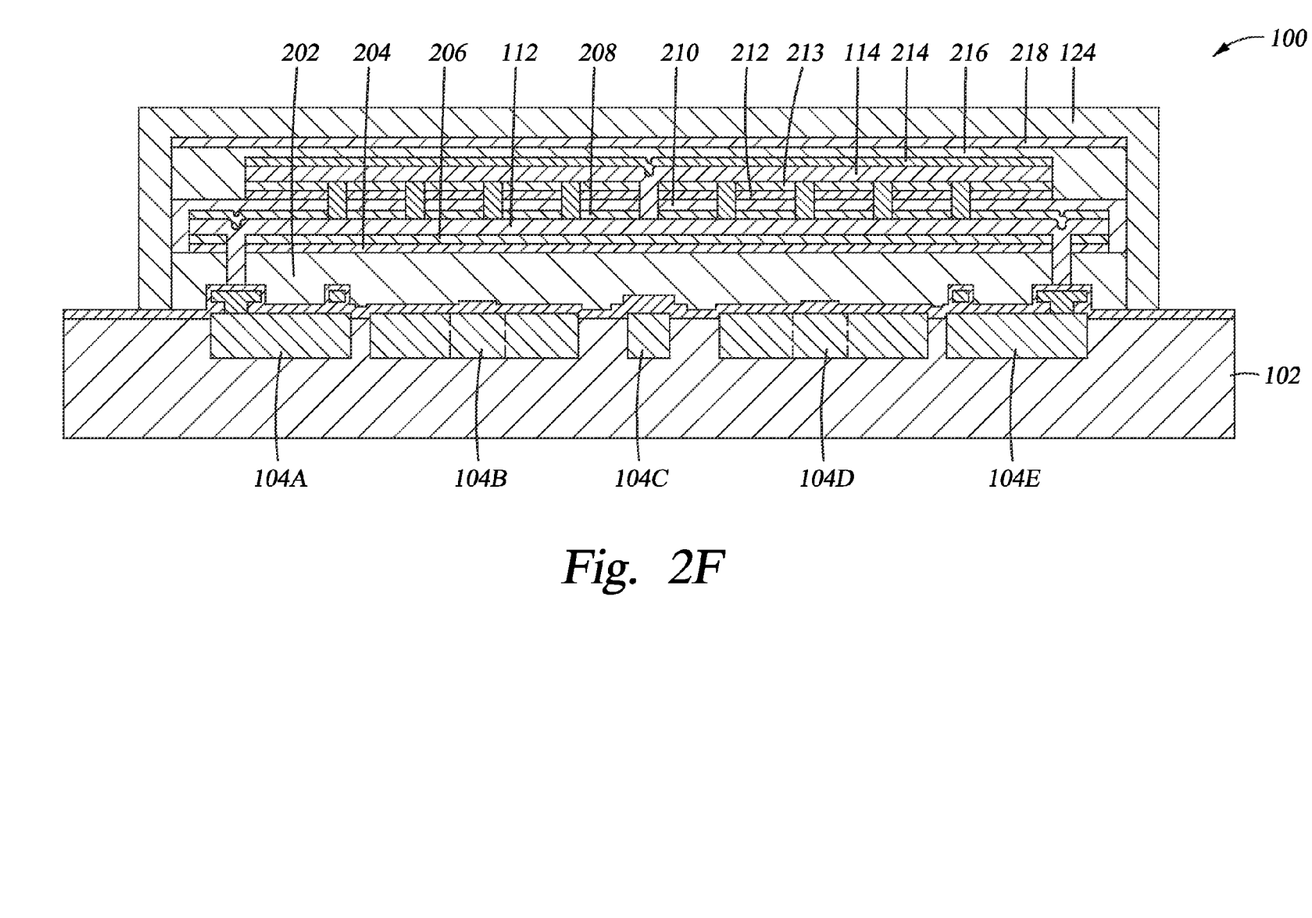
Figure 2G:
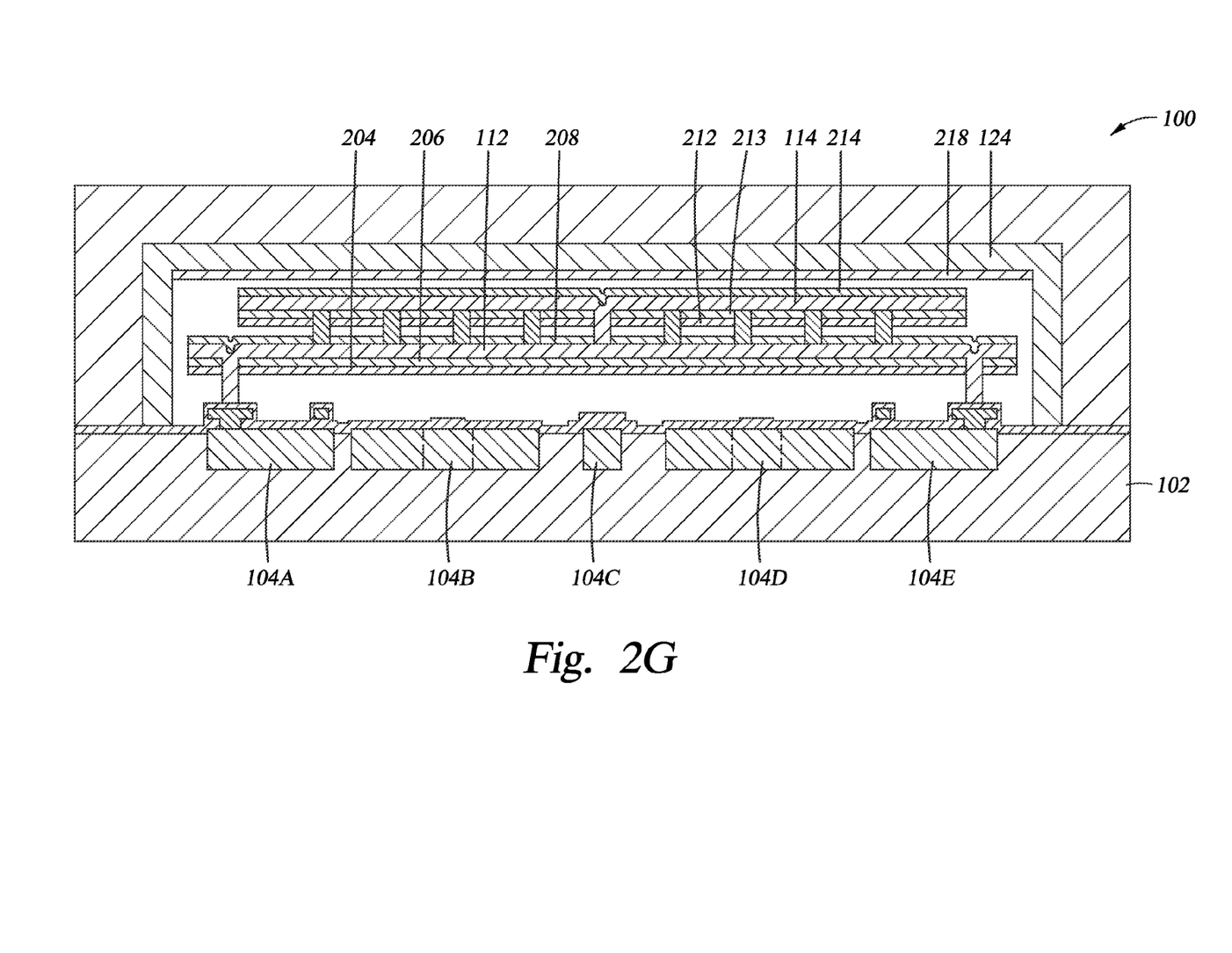

Once the silicon rich layer 218 has been formed, another dielectric layer 122 may be deposited thereover as shown in FIG. 2F. The dielectric layer 122 may comprise silicon oxide, silicon nitride or silicon oxynitride. The pull-up electrode 124 is then deposited. Finally, the sacrificial layers 202, 210, 216 are removed and an encapsulating layer 126 is deposited over the pull-up electrode 124 to seal the cavity as shown in FIG. 2G. The encapsulating layer 126 may comprise silicon nitride, silicon oxide or silicon oxynitride.

While not shown, it is to be understood that an adhesion promoter may be deposited over the dielectric layers prior to depositing the sacrificial material thereover. The adhesion promoter functions to ensure good adhesion when the sacrificial material is deposited over the dielectric material (i.e., opposite of the silicon rich layer which is used when the dielectric layer is deposited over the sacrificial material). The adhesion promoter may comprise a silicon based polymer.

Thus, during deposition, three separate silicon rich layers are deposited. The silicon rich dielectric layers are deposited on organic sacrificial material and then stoichiometric dielectric material is deposited on the silicon rich layers. The silicon rich layers are not stoichiometric while the dielectric layers are stoichiometric. The silicon rich layers have more silicon present than would be present in a stoichiometric material. The silicon rich layers permit good adhesion between organic material and a dielectric material. This in-turn avoids any risks of delaminating or blistering of the wafer during subsequent processing steps.

While the foregoing is directed to embodiments of the present invention, other and further embodiments of the invention may be devised without departing from the basic scope thereof, and the scope thereof is determined by the claims that follow.

The invention claimed is:

1. A method of forming a MEMS device, comprising:
depositing an organic based sacrificial layer over an electrode;
depositing a silicon rich layer comprises silicon oxide over the organic based sacrificial layer, wherein the silicon rich layer has an amount of silicon greater than a stoichiometric silicon layer;
depositing a dielectric layer over the silicon rich layer, wherein a ratio of silicon containing gas to oxygen containing gas is higher when depositing the silicon rich layer as compared to depositing the dielectric layer;
forming a movable plate over the dielectric layer; and
removing the sacrificial layer.

2. The method of claim 1, wherein the silicon rich silicon is deposited by PECVD.

3. The method of claim 2, wherein depositing the silicon rich layer comprises introducing silane and an oxygen containing gas into the processing chamber.

4. The method of claim 3, wherein the dielectric layer comprises silicon oxide and wherein the dielectric layer is deposited by PECVD.

5. The method of claim 1, wherein the oxygen containing gas comprises $N_2O$.

6. The method of claim 5, further comprising introducing $N_2$ during depositing the silicon rich layer.

7. The method of claim 6, wherein the silicon rich layer comprises multiple layers.

8. The method of claim 7, wherein the silicon rich layer has a thickness of about 1 nm to about 3 nm.

* * * * *